(12) United States Patent
Nasman

(10) Patent No.: US 9,523,151 B2
(45) Date of Patent: Dec. 20, 2016

(54) VAPORIZER UNIT WITH OPEN CELL CORE AND METHOD OF OPERATING

(71) Applicant: Tokyo Electron Limited, Minato-ku, Tokyo (JP)

(72) Inventor: Ronald Nasman, Averill Park, NY (US)

(73) Assignee: Tokyo Electron Limited, Tokyo (JP)

(*) Notice: Subject to any disclaimer, the term of this patent is extended or adjusted under 35 U.S.C. 154(b) by 59 days.

(21) Appl. No.: 14/186,258

(22) Filed: Feb. 21, 2014

(65) Prior Publication Data
US 2015/0240355 A1 Aug. 27, 2015

(51) Int. Cl.
*B05B 1/24* (2006.01)
*C23C 16/448* (2006.01)
*C23C 16/52* (2006.01)

(52) U.S. Cl.
CPC ........... *C23C 16/4483* (2013.01); *C23C 16/52* (2013.01)

(58) Field of Classification Search
CPC ................................................. C23C 16/4483
See application file for complete search history.

(56) References Cited

U.S. PATENT DOCUMENTS

| | | | | |
|---|---|---|---|---|
| 5,711,816 A * | 1/1998 | Kirlin | ..................... | C23C 16/18 118/726 |
| 6,210,485 B1 * | 4/2001 | Zhao | ................... | C23C 16/4481 118/715 |
| 7,975,593 B2 | 7/2011 | Schneider et al. | | |
| 7,975,993 B2 * | 7/2011 | Ono | ..................... | C23C 16/4486 261/103 |
| 8,343,583 B2 | 1/2013 | Jan Snijders et al. | | |
| 8,603,580 B2 | 12/2013 | Liu | | |
| 2003/0021595 A1 | 1/2003 | Xu et al. | | |
| | | (Continued) | | |

FOREIGN PATENT DOCUMENTS

| | | |
|---|---|---|
| JP | 2004-107729 | 4/2004 |
| JP | 2005-026599 | 1/2005 |

OTHER PUBLICATIONS

International Application No. PCT/US2015/014413, "International Search Report and Written Opinion," mailed May 22, 2015, International Filing Date Feb. 4, 2015.

(Continued)

*Primary Examiner* — Arthur O Hall
*Assistant Examiner* — Adam J Rogers
(74) *Attorney, Agent, or Firm* — Kristi L. Davidson

(57) ABSTRACT

A vaporizer for introducing a vapor-phase precursor into a substrate processing system, comprising: a vaporizer chamber having an vaporizer inlet, an vaporizer outlet, and a container wall extending between said vaporizer inlet and said vaporizer outlet and defining a vaporization volume there between, said container wall defining a lateral dimension of said vaporizer chamber; and at least one porous foam member arranged within said vaporizer chamber between said vaporizer inlet and said vaporizer outlet such that vapor flows through said at least one porous foam member, said at least one porous foam member in physical contact and thermal communication with said container wall, said at least one porous foam member having a thickness that is at least 10% said lateral dimension. The vaporizer chamber comprises an entrant chamber portion characterized by a diverging cross-sectional area with half angle of about 30-40 degrees and a vaporizer nozzle.

19 Claims, 7 Drawing Sheets

(56) References Cited

U.S. PATENT DOCUMENTS

| | | | |
|---|---|---|---|
| 2007/0101940 A1* | 5/2007 | Iizuka | C23C 16/4486 |
| | | | 118/726 |
| 2009/0223452 A1 | 9/2009 | Nasman et al. | |
| 2010/0247803 A1* | 9/2010 | Lee | C23C 16/30 |
| | | | 427/563 |
| 2010/0255198 A1* | 10/2010 | Cleary | C23C 16/4402 |
| | | | 427/255.39 |
| 2011/0126762 A1 | 6/2011 | Faguet et al. | |
| 2011/0197816 A1 | 8/2011 | Ono | |
| 2013/0099020 A1* | 4/2013 | Voser | B05B 1/06 |
| | | | 239/13 |

OTHER PUBLICATIONS

Taiwanese Patent Office, Office Action in counterpart Taiwanese Patent Application No. 104104902, dated Aug. 24, 2016.
International Bureau of WIPO, International Preliminary Report on Patentability issued in counterpart International Application No. PCT/US2015/014413 dated Sep. 1, 2016.

\* cited by examiner

VAPORIZER UNIT WITH OPEN CELL CORE AND METHOD OF OPERATING

BACKGROUND OF THE INVENTION

Field of Invention

The present invention relates to a method and system for substrate processing, and more particularly to a method and system for vaporizing a liquid-phase precursor for use in a substrate processing system.

Description of Related Art

During material processing, such as semiconductor device manufacturing for production of integrated circuits (ICs), vapor deposition is a common technique to form thin films, as well as to form conformal thin films over and within complex topography, on a substrate. Vapor deposition processes can include chemical vapor deposition (CVD) and plasma enhanced CVD (PECVD). For example, in semiconductor manufacturing, such vapor deposition processes may be used for gate dielectric film formation in front-end-of-line (FEOL) operations, and low dielectric constant (low-k) or ultra-low-k, porous or non-porous, dielectric film formation and barrier/seed layer formation for metallization in back-end-of-line (BEOL) operations, as well as capacitor dielectric film formation in DRAM production.

In a CVD process, a continuous stream of film precursor vapor is introduced to a process chamber containing a substrate, wherein the composition of the film precursor has the principal atomic or molecular species found in the film to be formed on the substrate. During this continuous process, the precursor vapor is chemisorbed on the surface of the substrate while it thermally decomposes and reacts with or without the presence of an additional gaseous component that assists the reduction of the chemisorbed material, thus, leaving behind the desired film.

In a PECVD process, the CVD process further includes plasma that is utilized to alter or enhance the film deposition mechanism. For instance, plasma excitation can allow film-forming reactions to proceed at temperatures that are significantly lower than those typically required to produce a similar film by thermally excited CVD. In addition, plasma excitation may activate film-forming chemical reactions that are not energetically or kinetically favored in thermal CVD. Other CVD techniques include hot-filament CVD (otherwise known as hot-wire CVD or pyrolytic CVD). In hot-filament CVD, a film precursor is thermally decomposed by a resistively heated filament, and the resulting fragmented molecules adsorb and react on the surface of the substrate to leave the desired film. Unlike PECVD, hot-filament CVD does not require formation of plasma.

Oftentimes, liquid phase film precursors are used in any one of the techniques described above, and thus, a vaporization system is required to produce film precursor vapor for delivery to the substrate. However, conventional vaporization systems, or evaporators, suffer from various deficiencies. First, current designs of evaporators include large liquid delivery line and chambers that allow low pressure flash vaporization at the control valve. Large hollow spaces in some evaporation chambers require wall temperatures to be elevated beyond desirable levels to overcome the thermal resistance of the low pressure carrier gas. Chemical contact with these surfaces induces decomposition of the liquid-phase precursor. Flash vaporization of the liquid-phase precursor leaves residue that eventually clogs or inhibits proper valve operation. Second, premature heating or over-heating of liquid-phase precursor causes chemical decomposition. Third, selective vaporization of carrying solvent leaves more viscous chemical to clog the delivery line. Water contamination of liquid-phase precursor or other liquids, for example, initiator chemicals, etc. can react with liquid-phase precursor and also clog the delivery line.

Fourth, recirculation zones in most vaporizer designs trap the chemicals, such as the liquid-phase precursor, for extended periods of time. Chemical decomposition generally increases with time, sometimes dramatically, depending on the liquid-phase precursor used. Fifth, nozzles in the vaporizer and their ability to generate small droplets are generally evaluated at atmospheric pressure. In a vacuum, they are not nearly as efficient and generate larger droplets than expected. Droplets of the liquid-phase precursor cool dramatically from evaporation and have to gain heat from surrounding gas to continue vaporizing. Evaporation is difficult in a vacuum environment with few gas molecules. Droplets of the liquid-phase precursor exist for longer periods and reduce in size slower than at atmospheric pressure. Vacuum gas flows often cannot entrain the droplets of the liquid-phase precursor so the droplets of the liquid-phase precursor hit the overheated vaporizer chamber walls and a portion flash evaporates and the rest decomposes. Decomposition of part of the liquid-phase precursor causes low deposition rate and poor deposition uniformity or even more disastrous results. There is a need for a vaporizer and a method that addresses the above operational issues in substrate processing.

SUMMARY OF THE INVENTION

Provided is a vaporizer for introducing a vapor-phase precursor into a substrate processing system, comprising: a vaporizer chamber having a vaporizer inlet, a vaporizer outlet, and a container wall extending between said vaporizer inlet and said vaporizer outlet and defining a vaporization volume there between, said container wall defining a lateral dimension of said vaporizer chamber; and at least one porous foam member arranged within said vaporizer chamber between said vaporizer inlet and said vaporizer outlet such that vapor flows through said at least one porous foam member, said at least one porous foam member in physical contact and thermal communication with said container wall, said at least one porous foam member having a thickness that is at least 10% of said lateral dimension. The vaporizer chamber comprises an entrant chamber portion characterized by a diverging cross-sectional area with half angle of about 30-40 degrees and a vaporizer nozzle.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
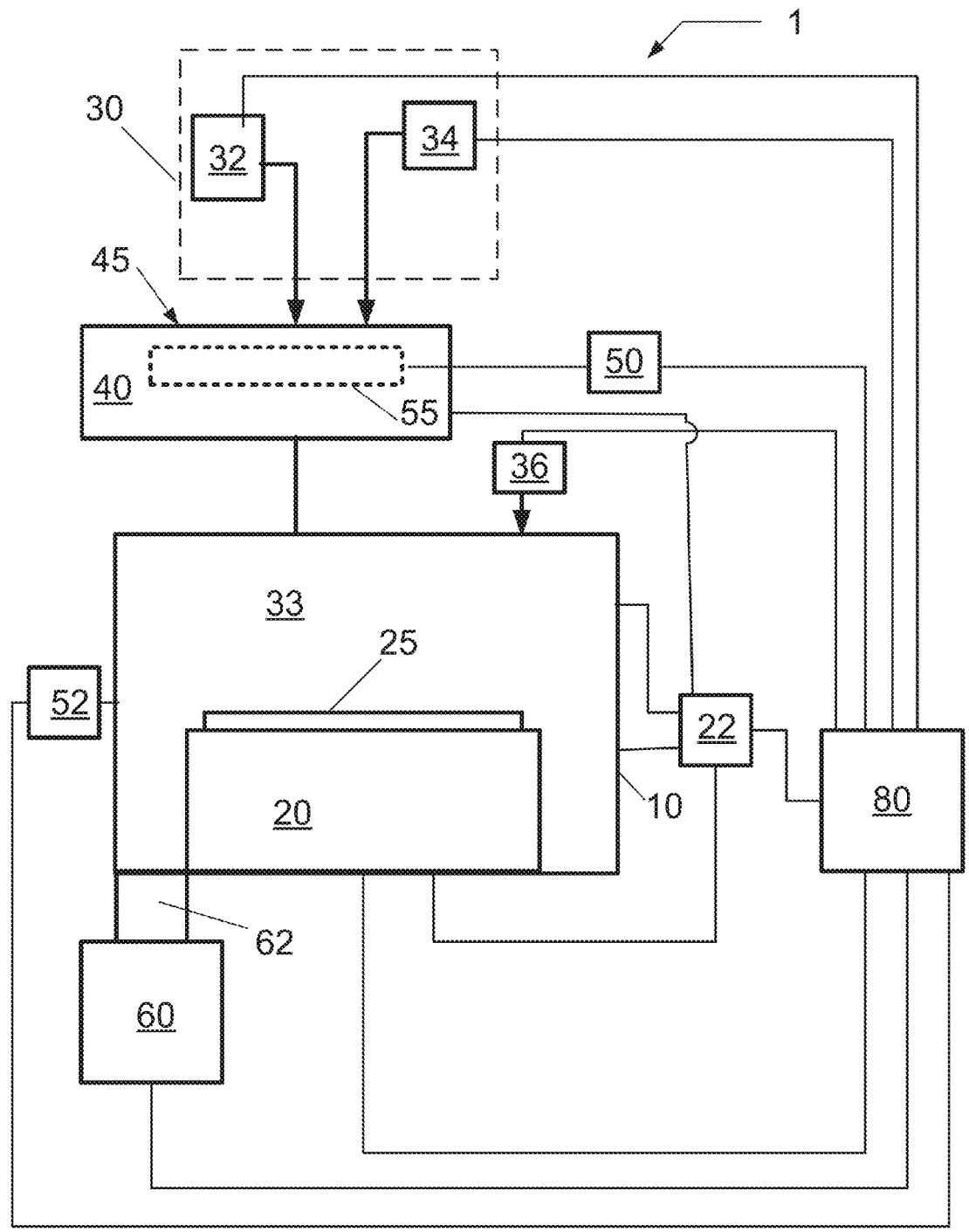
FIG. 1 is an exemplary simplified schematic of a control system used in a vaporizer in an embodiment of the present invention.

Methods and systems for vaporizing a liquid-phase precursor are disclosed in various embodiments. However, one skilled in the relevant art will recognize that the various embodiments may be practiced without one or more of the specific details, or with other replacement and/or additional methods, materials, or components. In other instances, well-known structures, materials, or operations Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, wherein like reference numerals designate identical or corresponding parts throughout the several views, FIG. 1 schematically illustrates a deposition system 1 for depositing a thin film, such as a conductive film, a non-conductive film, or a semi-conductive film. For example, the thin film can include a dielectric film, such as a low dielectric constant (low-k) or ultra-low-k dielectric film, or the thin film may include a sacrificial layer for use in air gap dielectrics. Deposition system 1 can include a chemical vapor deposition (CVD) system, whereby a film forming composition is thermally activated or decomposed in order to form a film on a substrate. Alternatively, deposition 1 can include a plasma enhanced chemical vapor deposition (PECVD) system, whereby a film forming composition is activated or decomposed with assistance by plasma in order to form a film on a substrate. Alternatively yet, the deposition system 1 can include a pyrolytic CVD system, whereby a film forming composition is activated or decomposed when interacting with a heating element in order to form a film on a substrate. And, while additional details are provided below for a CVD system, the vaporizer to be described may be used in any substrate processing system requiring vaporization of a liquid phase material, including an atomic layer deposition (ALD) system. The vaporizer in this invention can be used in vapor-phase processing in semiconductors, flat panel displays, and solar panel processing. In the area of vapor deposition systems, the vaporizer can be used in thermal CVD systems including pyrolytic CVD, plasma enhanced CVD, atomic layer deposition (ALD), and plasma enhanced ALD systems.

The deposition system 1 comprises a process chamber 10 having a substrate holder 20 configured to support a substrate 25, upon which the thin film is formed. Furthermore, the substrate holder 20 is configured to control the temperature of the substrate 25 at a temperature suitable for the film forming reactions.

The process chamber 10 is coupled to a film forming composition delivery system 30 configured to introduce a film forming composition to the process chamber 10 through a vaporizer 40. Furthermore, the vaporizer 40 includes a vaporizer chamber 45 having an inlet end coupled to an output from the film forming composition delivery system 30 and an outlet end coupled to the process chamber 10 through an optional gas distribution device. The vaporizer chamber 45 comprises one or more heating elements 55 disposed therein, and a power source 50 that is coupled to the one or more heating elements 55 and that is configured to deliver electrical power to the one or more heating elements 55. For example, the one or more heating elements 55 can comprise one or more conductively heated porous elements.

The process chamber 10 is further coupled to a vacuum pumping system 60 through a duct 62, wherein the vacuum pumping system 60 is configured to evacuate the process chamber 10 to a pressure suitable for forming the thin film on the substrate 25.

The film forming composition delivery system 30 can include one or more material sources configured to introduce a film forming composition to the vaporizer 40. For example, the film forming composition may include one or more gases, or one or more vapors formed in one or more gases, or a mixture of two or more thereof. The film forming composition delivery system 30 can include one or more gas sources, or one or more liquid sources, or a combination thereof. Herein vaporization refers to the transformation of a material (normally stored in a state other than a gaseous state) from a non-gaseous state to a gaseous or vapor state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

When the film forming composition is introduced to the vaporizer system 40, one or more constituents of the film forming composition are subjected to vaporization in the vaporization chamber 45 described above. The film forming composition can include film precursors that facilitate film formation on substrate 25 in the process chamber 10. The film precursor or precursors may include the principal atomic or molecular species of the film desired to be produced on the substrate. Additionally, the film forming composition can include a reducing agent. The reducing agent or agents may assist with the reduction of a film precursor on substrate 25. For instance, the reducing agent or agents may react with a part of or all of the film precursor on substrate 25. Additionally yet, the film forming composition can include a polymerizing agent (or cross-linker). The polymerizing agent may assist with the polymerization of a film precursor or fragmented film precursor on substrate 25.

According to one embodiment, when forming a copolymer thin film on substrate 25, a film forming composition comprising two or more monomers is introduced to the process chamber 10 in vapor-phase. These monomers are introduced to and distributed within process space 33 in the vicinity of the upper surface of substrate 25. Substrate 25 is maintained at a temperature lower than that of the vaporizer chamber 45 in order to condensate and induce polymerization of the chemically altered film forming composition at the upper surface of substrate 25.

For example, when forming an organosilicon polymer, monomer gas or gases of an organosilicon precursor is used. Additionally, for example, when forming a fluorocarbon-organosilicon copolymer, monomer gases of a fluorocarbon precursor and organosilicon precursor are used.

Further yet, the film forming composition can include an initiator. An initiator or fragmented initiator may assist with the fragmentation of a film precursor, or the polymerization of a film precursor. The use of an initiator can permit higher deposition rates at lower heat source temperatures. For instance, the one or more heating elements can be used to fragment the initiator to produce radical species of the initiator (i.e., a fragmented initiator) that are reactive with one or more of the remaining constituents in the film forming composition. Furthermore, for instance, the fragmented initiator or initiator radicals can catalyze the formation of radicals of the film forming composition.

For example, when forming a fluorocarbon-organosilicon copolymer, the initiator can be perfluorooctane sulfonyl fluoride (PFOSF) used in the polymerization of a cyclic vinylmethylsiloxane, such as 1,3,5-trivinyl-1,3,5-trimethyl-cyclotrisiloxane ($V_3D_3$).

Additionally, for example, when forming a porous SiCOH-containing film, the film forming composition may comprise a structure-forming material and a pore-generating material. The structure-forming material may comprise diethoxymethylsilane (DEMS) and the pore-generating material may comprise alpha-terpinene (ATRP). The porous SiCOH-containing film may be used as a low dielectric constant (low-k) material.

Further, for example, when forming a cross-linked neopentyl methacrylate organic glass, the film forming composition may comprise a monomer, a cross-linker, and an initiator. The monomer may comprise trimethylsilylmethyl methacrylate (TMMA), propargyl methacrylate (PMA), cyclopentyl methacrylate (CPMA), neopentyl methacrylate (npMA), and poly (neopentyl methacrylate) (P(npMA)), and the cross-linker may comprise ethylene glycol diacrylate (EGDA), ethylene glycol dimethacrylate (EGDMA), 1,3-propanediol diacrylate (PDDA), or 1,3-propanediol dimethacrylate (PDDMA), or any combination of two or more thereof. Additionally, the initiator may comprise a peroxide, a hydroperoxide, or a diazine. Additionally yet, the initiator may comprise a tert-butyl peroxide (TBPO).

Further yet, for example, the polymer film may comprise P(npMA-co-EGDA) (poly(neopentyl methacrylate-co-ethylene glycol diacrylate)), and the monomer comprises npMA (neopentyl methacrylate) and the cross-linker comprises EGDA (ethylene glycol diacrylate). The polymer film may be used as a sacrificial air gap material.

According to one embodiment, the film forming composition delivery system 30 can include a first material source 32 configured to introduce one or more film precursors to the vaporizer 40, and a second material source 34 configured to introduce a (chemical) initiator to the vaporizer 40. Furthermore, the film forming gas delivery system 30 can include additional gas sources configured to introduce an inert gas, a carrier gas or a dilution gas. For example, the inert gas, carrier gas or dilution gas can include a noble gas, i.e., He, Ne, Ar, Kr, Xe, or Rn.

According to another embodiment, the film forming composition delivery system 30 can include a first material source 32 configured to introduce one or more film precursors to the vaporizer 40, a second material source 34 configured to introduce a (chemical) initiator to the vaporizer 40, and/or a third material source 36 configured to introduce a vapor-phase precursor to the vaporizer 40. The third material source 36 can be a vaporizer comprising a vaporizer chamber and at least one porous foam member arranged within said vaporizer. Device details of the vaporizer are discussed in subsequent figures. Furthermore, the film forming gas delivery system 30 can include additional gas sources configured to introduce an inert gas, a carrier gas or a dilution gas. For example, the inert gas, carrier gas or dilution gas can include a noble gas, i.e., He, Ne, Ar, Kr, Xe, or Rn.

Referring again to FIG. 1, the power source 50 is configured to provide an electrical power to the one or more heating elements 55 in the vaporizer 40. For example, the power source 50 can be configured to deliver either DC power or AC power. Additionally, for example, the power source 50 can be configured to modulate the amplitude of the power, or pulse the power. Furthermore, for example, the power source 50 can be configured to perform at least one of setting, monitoring, adjusting or controlling a power, a voltage, or a current. In another embodiment, an optional plasma generator 52 can be coupled to the process chamber 10 for a plasma enhanced CVD processing of the substrate 25.

Referring still to FIG. 1, a temperature control system 22 can be coupled to the vaporizer 40, the vaporizer chamber 45, the process chamber 10 and/or the substrate holder 20, and configured to control the temperature of one or more of these components. The temperature control system 22 can include a temperature measurement system configured to measure the temperature of the vaporizer 40 at one or more locations, the temperature of the vaporizer chamber 45 at one or more locations, the temperature of the process chamber 10 at one or more locations and/or the temperature of the substrate holder 20 at one or more locations. The measurements of temperature can be used to adjust or control the temperature at one or more locations in deposition system 1.

The temperature measuring device, utilized by the temperature measurement system, can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

Alternatively, when measuring the temperature of one or more resistive heating elements, the electrical characteristics of each resistive heating element can be measured. For example, two or more of the voltage, current or power coupled to the one or more resistive heating elements can be monitored in order to measure the resistance of each resistive heating element. The variations of the element resistance can arise due to variations in temperature of the element which affects the element resistivity.

According to program instructions from the temperature control system 22 or the controller 80 or both, the power source 50 can be configured to operate the vaporizer chamber 45, e.g., the one or more porous gas distribution elements, at a temperature ranging from approximately 100 degrees C. to approximately 600 degrees C. For example, the temperature can range from approximately 200 degrees C. to approximately 550 degrees C. The temperature can be selected based upon the film forming composition and, more particularly, the temperature can be selected based upon a constituent of the film forming composition.

Additionally, according to program instructions from the temperature control system 22 or the controller 80 or both, the temperature of the vaporizer 40 can be set to a value approximately equal to or less than the temperature of the vaporizer chamber 45, i.e., the one or more heating elements. For example, the temperature can be a value less than or equal to approximately 600 degrees C. Additionally, for example, the temperature can be a value less than approximately 550 degrees C. Further yet, for example, the temperature can range from approximately 80 degrees C. to approximately 550 degrees C. The temperature can be selected to be approximately equal to or less than the temperature of the one or more heating elements, and to be sufficiently high to prevent condensation which may or may not cause film formation on surfaces of the gas distribution system and reduce the accumulation of residue.

Additionally yet, according to program instructions from the temperature control system 22 or the controller 80 or both, the temperature of the process chamber 10 can be set to a value less than the temperature of the vaporizer 45, i.e., the one or more heating elements. For example, the temperature can be a value less than approximately 200 degrees C. Additionally, for example, the temperature can be a value less than approximately 150 degrees C. Further yet, for example, the temperature can range from approximately 80 degrees C. to approximately 150 degrees C. However, the temperature may be the same or less than the temperature of the vaporizer 40. The temperature can be selected to be less than the temperature of the one or more resistive film heating elements, and to be sufficiently high to prevent condensation which may or may not cause film formation on surfaces of the process chamber and reduce the accumulation of residue.

Once film forming composition enters the process space 33, the film forming composition adsorbs on the substrate surface, and film forming reactions proceed to produce a thin film on the substrate 25. According to program instructions from the temperature control system 22 or the controller 80 or both, the substrate holder 20 is configured to set the temperature of substrate 25 to a value less than the temperature of the vaporizer chamber 45, the temperature of the vaporizer 40, and the process chamber 10. For example, the substrate temperature can range up to approximately 80 degrees C. Additionally, the substrate temperature can be approximately room temperature. For example, the substrate temperature can range up to approximately 25 degrees C. However, the temperature may be less than or greater than room temperature.

The substrate holder 20 comprises one or more temperature control elements coupled to the temperature control system 22. The temperature control system 22 can include a substrate heating system, or a substrate cooling system, or both. For example, substrate holder 20 can include a substrate heating element or substrate cooling element (not shown) beneath the surface of the substrate holder 20. For instance, the heating system or cooling system can include a re-circulating fluid flow that receives heat from substrate holder 20 and transfers heat to a heat exchanger system (not shown) when cooling, or transfers heat from the heat exchanger system to the substrate holder 20 when heating. The cooling system or heating system may include heating/cooling elements, such as resistive heating elements, or thermo-electric heaters/coolers located within substrate holder 20. Additionally, the heating elements or cooling elements or both can be arranged in more than one separately controlled temperature zone. The substrate holder 20 may have two thermal zones, including an inner zone and an outer zone. The temperatures of the zones may be controlled by heating or cooling the substrate holder thermal zones separately.

Additionally, the substrate holder 20 comprises a substrate clamping system (e.g., electrical or mechanical clamping system) to clamp the substrate 25 to the upper surface of substrate holder 20. For example, substrate holder 20 may include an electrostatic chuck (ESC).

Furthermore, the substrate holder 20 can facilitate the delivery of heat transfer gas to the back-side of substrate 25 via a backside gas supply system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25.

Vacuum pumping system 60 can include a turbo-molecular vacuum pump (TMP) capable of a pumping speed up to approximately 5000 liters per second (and greater) and a gate valve for throttling the chamber pressure. For example, a 1000 to 3000 liter per second TMP can be employed. TMPs can be used for low pressure processing, typically less than approximately 1 Torr. For high pressure processing (i.e., greater than approximately 1 Torr), a mechanical booster pump and dry roughing pump can be used. Furthermore, a device for monitoring chamber pressure (not shown) can be coupled to the process chamber 10. The pressure measuring device can be, for example, a Type 628B Baratron absolute capacitance manometer commercially available from MKS Instruments, Inc. (Andover, Mass.).

Referring still to FIG. 1, the deposition system 1 can further comprise a controller 80 that comprises a microprocessor, memory, and a digital I/O port capable of generating control voltages sufficient to communicate and activate inputs to deposition system 1 as well as monitor outputs from deposition system 1. Moreover, controller 80 can be coupled to and can exchange information with the process chamber 10, the substrate holder 20, the temperature control system 22, the film forming composition supply system 30, the vaporizer system 40, the vaporizer chamber 45, and the vacuum pumping system 60, as well as the backside gas delivery system (not shown), and/or the electrostatic clamping system (not shown). A program stored in the memory can be utilized to activate the inputs to the aforementioned components of deposition system 1 according to a process recipe in order to perform the method of depositing a thin film.

Controller 80 may be locally located relative to the deposition system 1, or it may be remotely located relative to the deposition system 1 via an internet or intranet. Thus, controller 80 can exchange data with the deposition system 1 using at least one of a direct connection, an intranet, or the internet. Controller 80 may be coupled to an intranet at a customer site (i.e., a device maker, etc.), or coupled to an intranet at a vendor site (i.e., an equipment manufacturer). Furthermore, another computer (i.e., controller, server, etc.) can access controller 80 to exchange data via at least one of a direct connection, an intranet, or the internet.

The deposition system 1 can be periodically cleaned using an in-situ cleaning system (not shown) coupled to, for example, the process chamber 10 or the vaporizer 40. Per a frequency determined by the operator, the in-situ cleaning system can perform routine cleanings of the deposition system 1 in order to remove accumulated residue on internal surfaces of deposition system 1. The in-situ cleaning system can, for example, comprise a radical generator configured to introduce chemical radical capable of chemically reacting and removing such residue. Additionally, for example, the in-situ cleaning system can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Although the porous gas distribution device has been described for use in a deposition system, the porous gas distribution device and vaporizer may be used in any system requiring gas heating and vaporization of a liquid-phase material. Other such systems in semiconductor manufacturing and integrated circuit (IC) manufacturing may include etching systems, plasma-enhanced etch systems, thermal processing systems, and the like.

Figure 2:
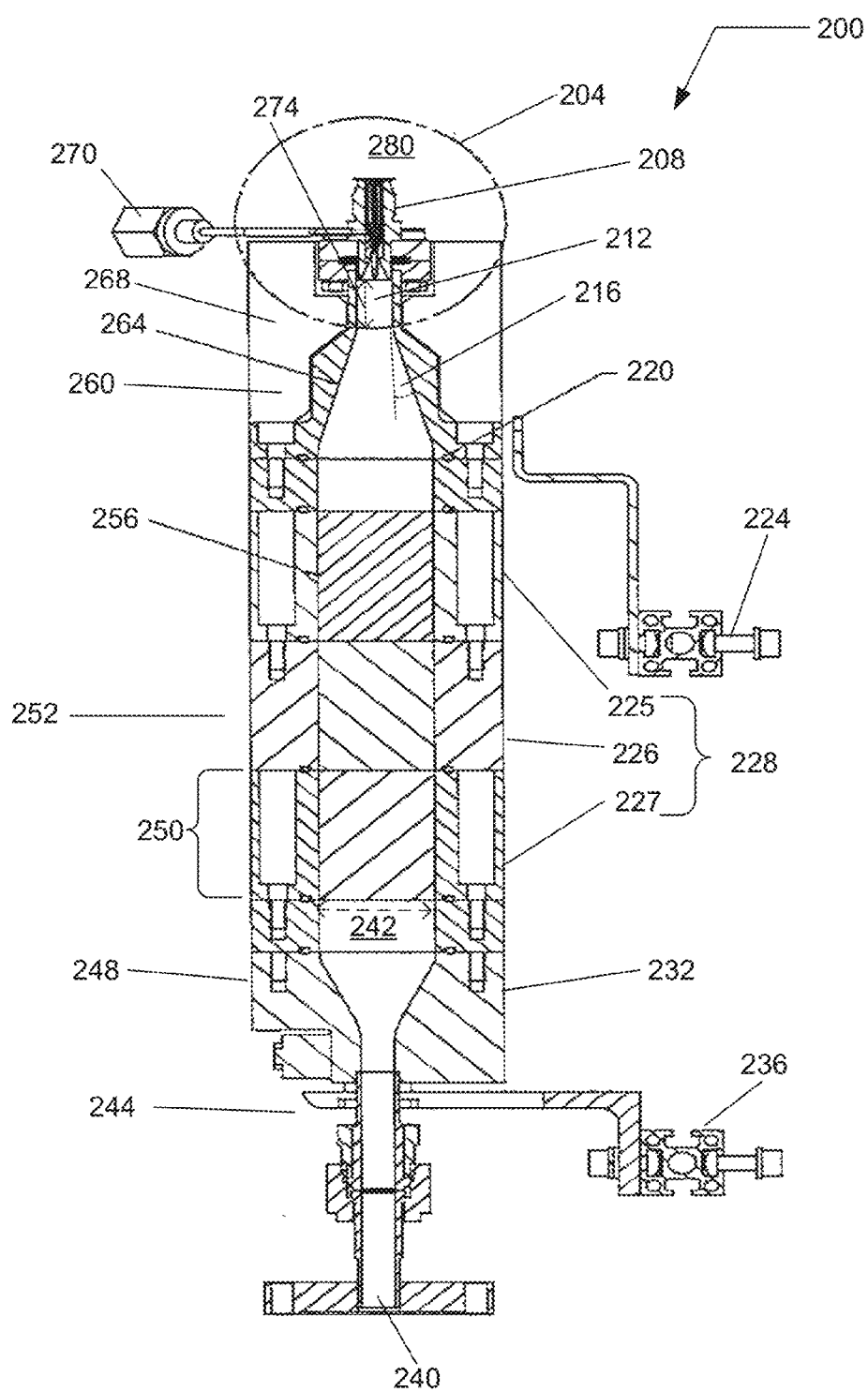
FIG. 2 is an exemplary simplified schematic of a vaporizer in an embodiment of the present invention.

FIG. 2 is an exemplary simplified schematic of a vaporizer 200 in an embodiment of the present invention. The vaporizer 200 comprises a vaporizer chamber 252 having a vaporizer inlet 212, a vaporizer outlet 240, and a container wall 232 extending between the vaporizer inlet 212 and the vaporizer outlet 240 and defining a vaporization volume there between, the container wall 232 defining a lateral dimension 242 of the vaporizer chamber 252. The vaporizer 200 also comprises at least one porous foam member 225, 226, and 227 (228), arranged within the vaporizer chamber 252 between the vaporizer inlet 212 and the vaporizer outlet 240. The at least one porous foam member 228 is configured such that vapor flows through the at least one porous foam member 228, the at least one porous foam member 228 is in physical contact and thermal communication with the container wall 232, the at least one porous foam member 228 having a thickness 250 that is at least 10% of the lateral dimension 242. Use of a ratio of thickness 250 to the lateral dimension 242 ensures that the operating issues that can cause undue decomposition of the liquid-phase precursor are minimized.

The porous foam member 228 may include an open-celled metal foam, porous metal or metal sponge. The porous foam generally consists of bubble structures which include about 14 reticulated windows or facets. The polygonal opening through each open window is referred to as a "pore". In any given bubble, the polygonal pores actually are of two or three different characteristic sizes and shapes, but for material designation purposes, they are simplified to an average size and circular shape. The number of these pores per inch, porosity, then designates the foam "pore size". In an embodiment, the at least one porous foam member 228 can have a porosity ranging from about 5 pores per inch to about 200 pores per inch. In another embodiment, the porosity of the at least one porous foam member 228 can further have a porosity ranging from about 10 pores per inch to about 100 pores per inch. Each of the at least one porous foam member 228 may have a different porosity. For example, in an embodiment, the first porous form member 225 can have a porosity of 100 pores per inch, the second porous form member 226 can have a porosity of 50 pores per inch, and the third porous form member 225 can have a porosity of 25 pores per inch. In another embodiment, the first porous form member 225 can have a porosity of 80 pores per inch and subsequent porous foam members can have a porosity of 50 pores or less per inch. The choice of porosity of the porous form members are based on the deposition application and liquid-phase precursor used.

The at least one porous foam member 228 can comprise an open celled metal foam and the open celled metal foam can comprise an open celled aluminum foam. As an example, the open-celled foam may include Duocel® Foam that is commercially available from ERG Materials and Aerospace Corporation (900 Stanford Avenue, Oakland, Calif. 94608). A wide range of materials are commercially offered by ERG Materials and Aerospace Corporation including, but not limited to, aluminum, copper, tin, zinc, nickel, Inconel, silicon, silver, gold, silicon carbide, silicon nitride, silicon nitride carbide, boron carbide, boron nitride, hafnium carbide, tantalum carbide, and zirconium carbide. Various materials may be vapor deposited onto an existing open-celled foam including, for example, sputter-deposited tungsten.

The vaporizer chamber 252 can comprise an entrant chamber portion 268 characterized by a diverging cross-sectional area 260 in a direction of vapor flow entering said vaporizer chamber 252 from said vaporizer inlet 212. The entrant chamber portion 268 can comprise a diverging conical section 264 characterized by an entrant length 274 and a half-angle 216 defining said diverging conical section 264. The half angle 216 can be less than or equal to about 40 degrees or less than or equal to about 30 degrees.

In an embodiment, the vaporizer 200 can further be coupled to a temperature control system 22, FIG. 1, having a temperature control element in thermal communication with said container wall 232 and configured to elevate a temperature of said container wall 232 in excess of 100 degrees C. In another embodiment, the vaporizer 200 can comprise an exhaust chamber portion 244 characterized by a converging cross-sectional area 248 in a direction of vapor flow exiting said vaporizer chamber 252 through said vaporizer outlet 240. In FIG. 2, the vaporizer 200 comprises a vaporizer nozzle area 280, the area enclosed in the line-dot circle 204 including a nozzle 208, where the exit of the nozzle 208 is fluidically coupled to said vaporizer inlet 212 to said vaporizer chamber 252. The vaporizer 200 further comprises a carrier gas delivery device 270, a porous foam area 256, a sealing device 220, and clamps, 224 and 236. The sealing device 220 can be a metal seal which helps limit the permeation of water and gases through.

Figure 3A:
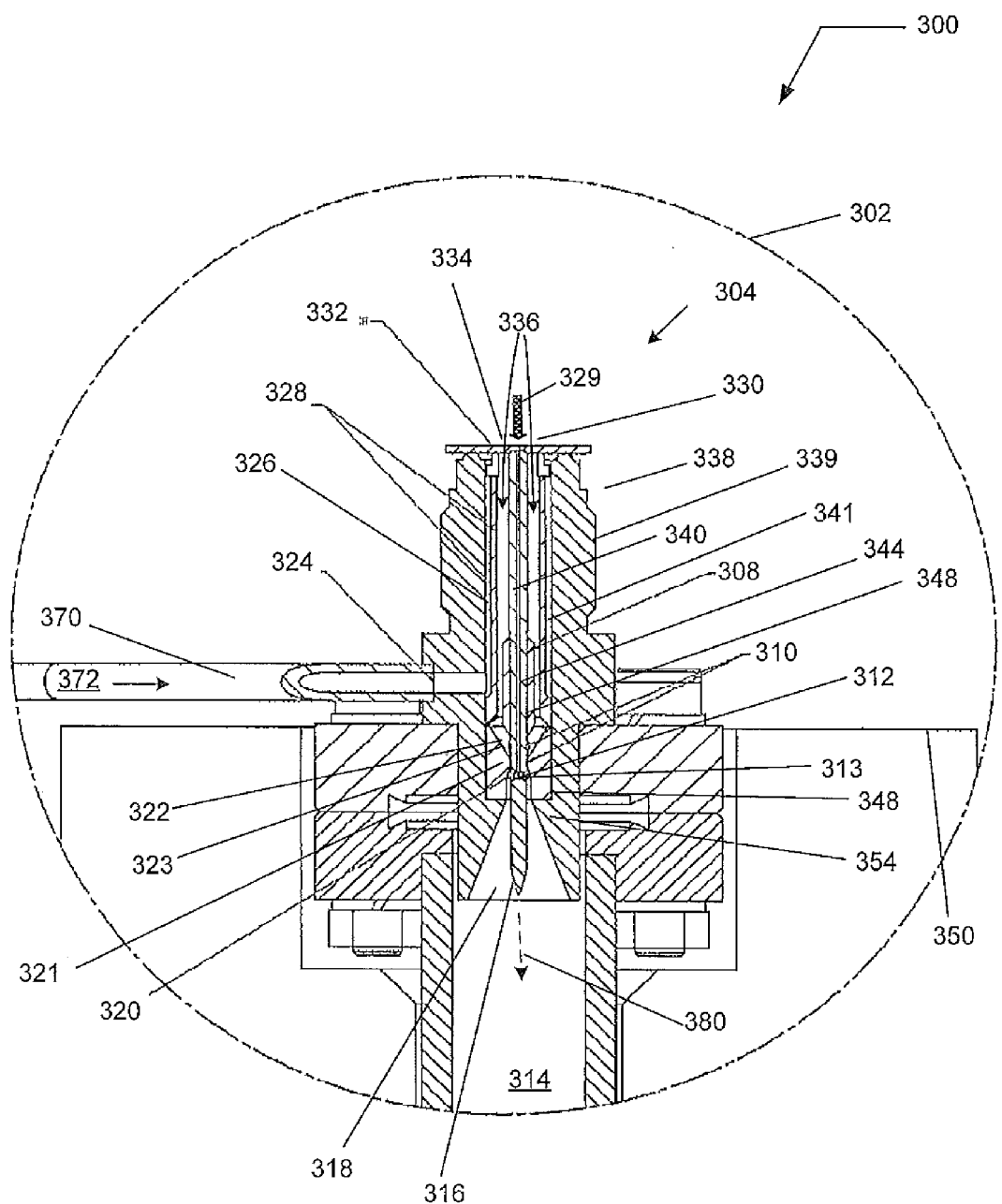
FIG. 3A is an exemplary simplified schematic of a nozzle of the vaporizer in an embodiment of the present invention.
Figure 3B:
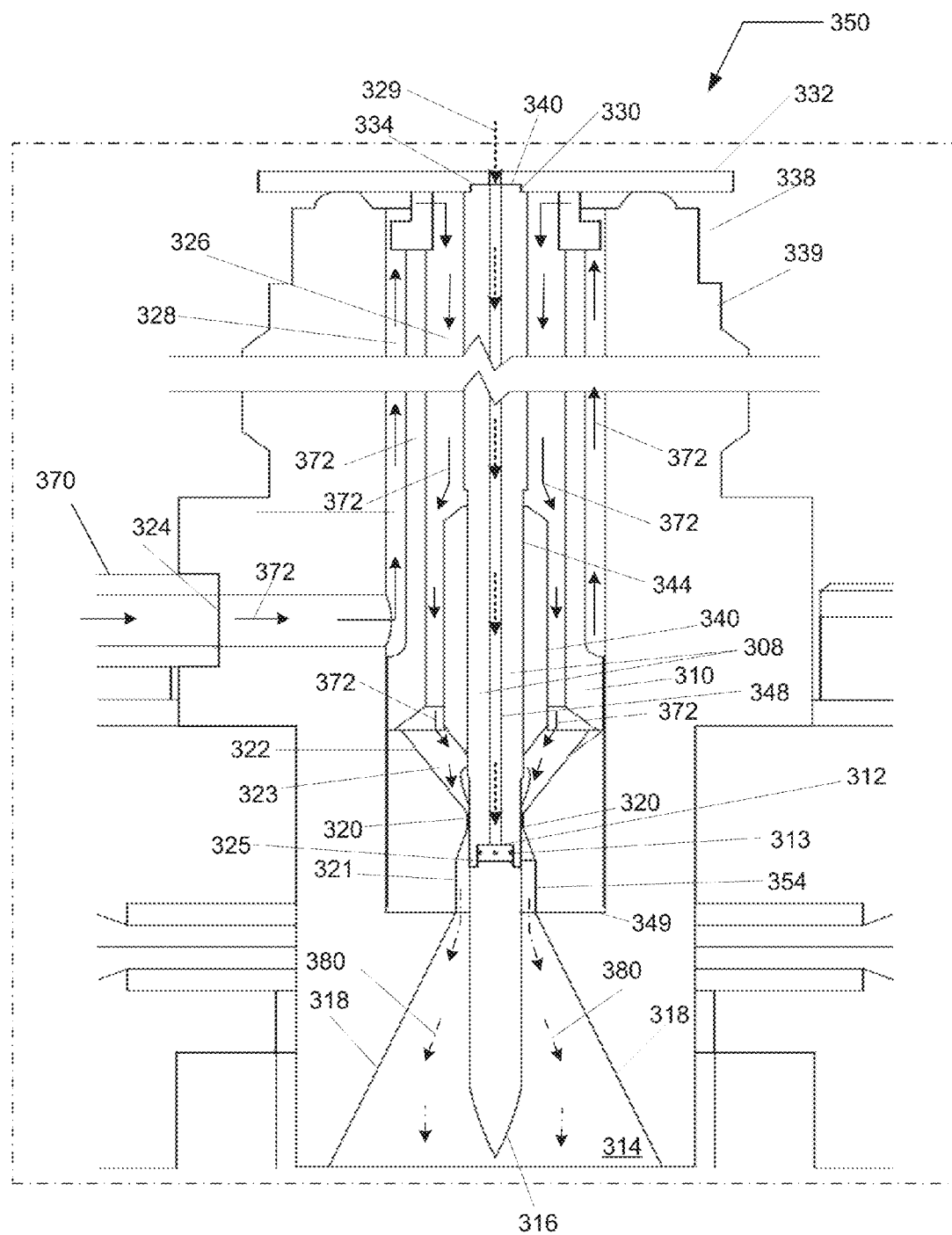
FIG. 3B is an exemplary simplified schematic of the nozzle of the vaporizer where more details are depicted.
Figure 3C:
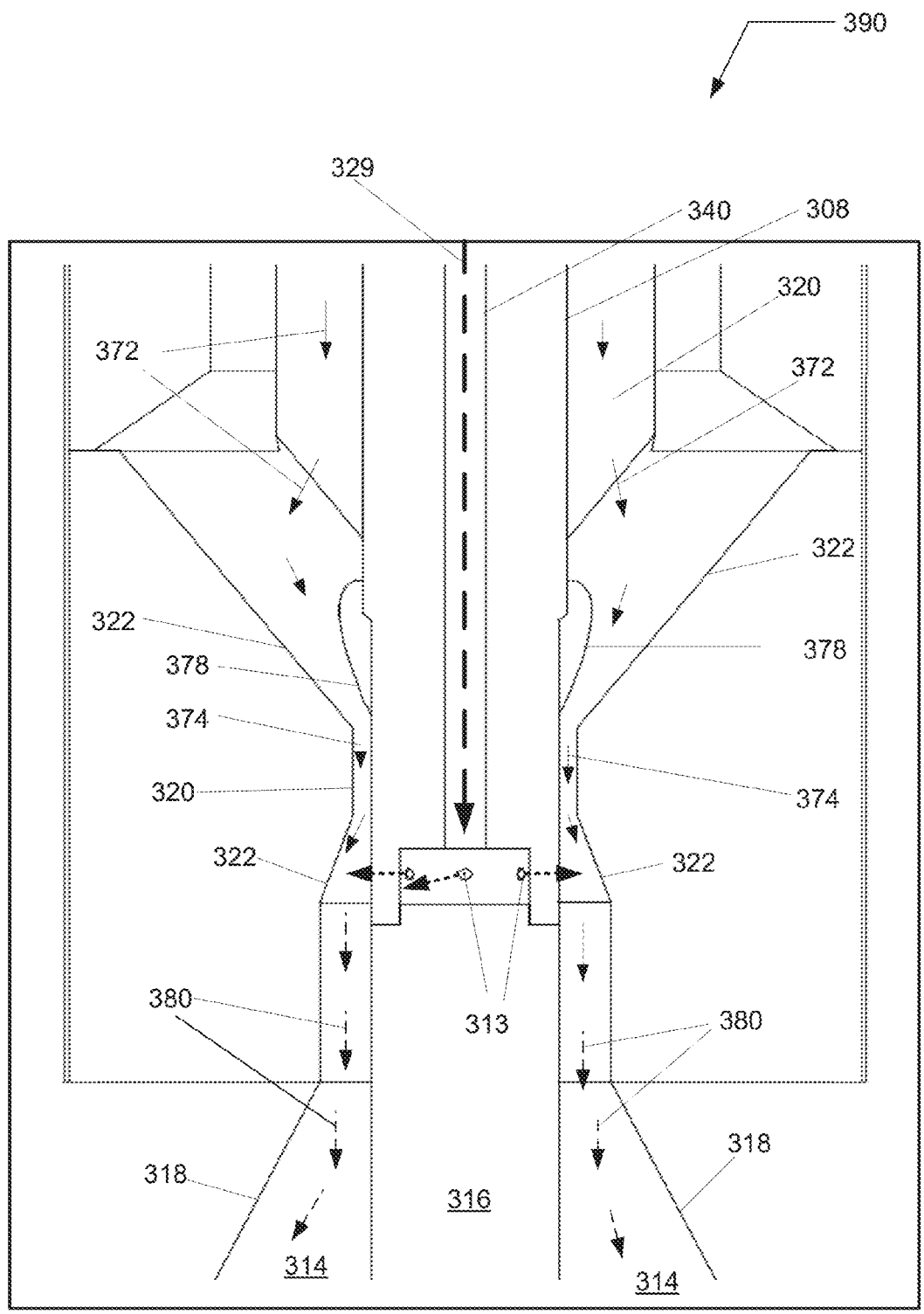
FIG. 3C is an exemplary simplified schematic of the nozzle of the vaporizer where further additional details are depicted in the convergent, throat, mixing, and divergent sections of the nozzle in an embodiment of the present invention.

FIGS. 3A, 3B, and 3C shall be discussed concurrently in order to facilitate the description of the various components of the nozzle at different perspectives and description of the flows of carrier gas, liquid-phase precursor, and vapor-phase precursors in the vaporizer. Like numbers in the three figures refer to the same component. It should be noted that not all components are shown in all three figures. FIG. 3A is an exemplary simplified schematic 300 of a nozzle of the vaporizer in an embodiment of the present invention; FIG. 3B is an exemplary simplified schematic of the nozzle of the vaporizer where more details are depicted; and FIG. 3C is an exemplary simplified schematic of the nozzle of the vaporizer where further additional details are depicted in the convergent, throat, mixing, and divergent sections of the nozzle in an embodiment of the present invention.

Referring now to FIG. 3A, the vaporizer nozzle 304 comprises a nozzle body 338 having an nozzle inlet end 330 through which a process chemical, for example, a liquid-phase precursor 329, is introduced, a carrier gas 372 is delivered using a carrier gas delivery device 370 through carrier gas inlet 324 through which carrier gas 372 is introduced, and a nozzle outlet end 314 through which a gas jet 380 containing a vapor-phase precursor and said carrier gas emanate from said nozzle body 338. The nozzle body 338 is defined by a coannular inlet channel 310, a convergent section 322, a throat section 320, and a divergent section 318; and a nozzle center body 340 longitudinally extending through said nozzle body 338 from said nozzle inlet end 330 to said nozzle outlet end 314. The nozzle center body 340 has a nozzle first end 334 with a flange 332 configured to sealably couple to said nozzle inlet end 330 of said nozzle body 338 and a nozzle second end 348 extending into said divergent section 318 of said nozzle body 338.

Still referring to FIG. 3A, said nozzle center body 340 can further include a center conduit 308 partially extending from said nozzle first end 334 towards said nozzle second end 349 along a centerline thereof to a conduit end 325 and two or more openings 313 through a sidewall 312 of said nozzle center body 340. The coannular inlet channel 310 comprises an outer annular channel 328 configured to receive said carrier gas 372 from said carrier gas inlet 324, and an inner annular channel 326 configured to receive said carrier gas 372 from said outer annular channel 328 and distribute said carrier gas 372 for introduction into said throat section 320.

The liquid-phase precursor 329 is introduced through said nozzle inlet end 330, flows through said center conduit 308 to said conduit end 325, exits said nozzle center body 340 through said two or more openings 313 in said sidewall 312 in a direction substantially normal to said carrier gas 372, and mixes with said carrier gas 372 downstream of said throat section 320. The vaporizer 200 wherein said outer annular channel 328 and said inner annular channel 326 are arranged such that said carrier gas 372 enters through said carrier gas inlet 324 into said outer annular channel 328, flows in a direction opposite said carrier gas 372 towards said nozzle inlet end 330 of said outer nozzle body 338, then enters said inner annular channel 326 through an opening proximate said nozzle inlet end 329, and flows in the same direction as said carrier gas 372 to said throat section 320. The convergent section 322 comprises an annular convergent section. Furthermore, the convergent section 322 comprises a plurality of gas conduits, (only a left and a right conduit shown), coupling said inner annular channel 326 to said throat section 320. In addition, the throat section 320 comprises an annular throat section 320. The outer nozzle body 338 further defines a mixing section 321 disposed between said throat section 320 and said divergent section 318, and wherein said mixing section 321 receives said carrier gas 372 from said throat section 320 and said vapor-phase precursor from said two or more openings 313 in said sidewall 312 of said nozzle center body 340, wherein said mixing section 321 comprises an annular mixing section 354, and wherein said outer nozzle body 338 and said nozzle center body 340 form an annular throat section 320 and an annular divergent section 318 there between.

Furthermore, the outer nozzle body 338 comprises an nozzle body 339 having a cylindrical cavity 348 partially extending inward from said nozzle inlet end 330 towards said nozzle outlet end 314 and a conical cavity 323 partially extending inward from said nozzle outlet end 314 towards said nozzle inlet end 330 wherein said conical cavity 323 intersects with said cylindrical cavity 348 to form an opening therebetween; and an inner nozzle body 344 insertible within said cylindrical cavity 348, said inner nozzle body 344 having an opening 313 configured to receive said nozzle center body 340 extending there through from said nozzle inlet end 330 to said nozzle outlet end 314, a cylindrical wall that separates said outer annular channel 328 from said inner annular channel 326, and an inner surface that together with an outer surface of said nozzle center body 340 defines said throat section 320 and said divergent section 318.

Moreover, the outer nozzle body 339 comprises a sealing surface located at said nozzle inlet end 330 for sealably mating with said flange 332 of said nozzle center body 340, and wherein said carrier gas inlet 324 is located on a side of said nozzle 304 such that carrier gas 372 enters said nozzle body 338 in a direction normal to said gas jet 380.

Referring now to FIG. 3B, the carrier gas 372 is delivered using a carrier gas delivery device 370 through carrier gas inlet 324 and introduces the carrier gas 372 flowing from a horizontal direction to an upward direction into the outer annular channel 328 towards the nozzle first end 334. Having the carrier gas 372 come in from the side creates a high pressure zone on the opposite side of the nozzle 304 causing an unbalanced flow in the nozzle 304. In order to remove the imbalance of the flow, the carrier gas 372 is diverted upward through the outer annular channel 328 and then down using the inner annular channel 326 toward the nozzle second end 349, thus allowing the pressure to balance and the flow to stabilize. After passing through the nozzle first end 334, the carrier gas 372 goes down through the inner annular channel 326 towards the nozzle second end 349. The liquid-phase precursor 329, indicated in the drawing as a dotted line arrow, enters from the top at the nozzle inlet end 330 and goes down through the center conduit 308 of the nozzle center body 340 towards the conduit end 325.

FIG. 3C is an exemplary simplified schematic 390 of the nozzle of the vaporizer where further additional details are depicted in the convergent 322, throat 320, mixing 321, and divergent 318 sections of the nozzle 304 in an embodiment of the present invention. The downward-moving carrier gas 372 flows into the convergent section 322 where the volumetric space is greater, then the volumetric space rapidly decreases as the flow annular space becomes smaller at the point where the carrier gas 372 passes by the accelerator ring 378 and into the very narrow space of the throat section 320. The carrier gas 372, (now designated a gas jet 380), acquires speed in the supersonic speed range. The liquid-phase precursor 329 proceeds downwards through the nozzle center body 340 towards the nozzle second end 353 where the liquid-phase precursor 329 is injected into the supersonic flow of the carrier gas 380 using two or more openings 313 of the sidewall 312. The cross section of the opening area is limited to address requirements of selective vaporization of multi-component fluids introduced in either the gas jet 380 and in the liquid-phase precursor 329 or both. In one embodiment, the liquid-phase precursor 329 is flash-vaporized after exposure to the supersonic gas jet 380. By limiting the size of the two or more openings 313, the surface area available for evaporation is greatly reduced and as long as the fluid flow rate exceeds the vaporization rate of the solvent in the liquid-phase precursor 329 by some margin, the two or more openings 313 will still operate as desired, i.e. without getting clogged up.

Figure 4:
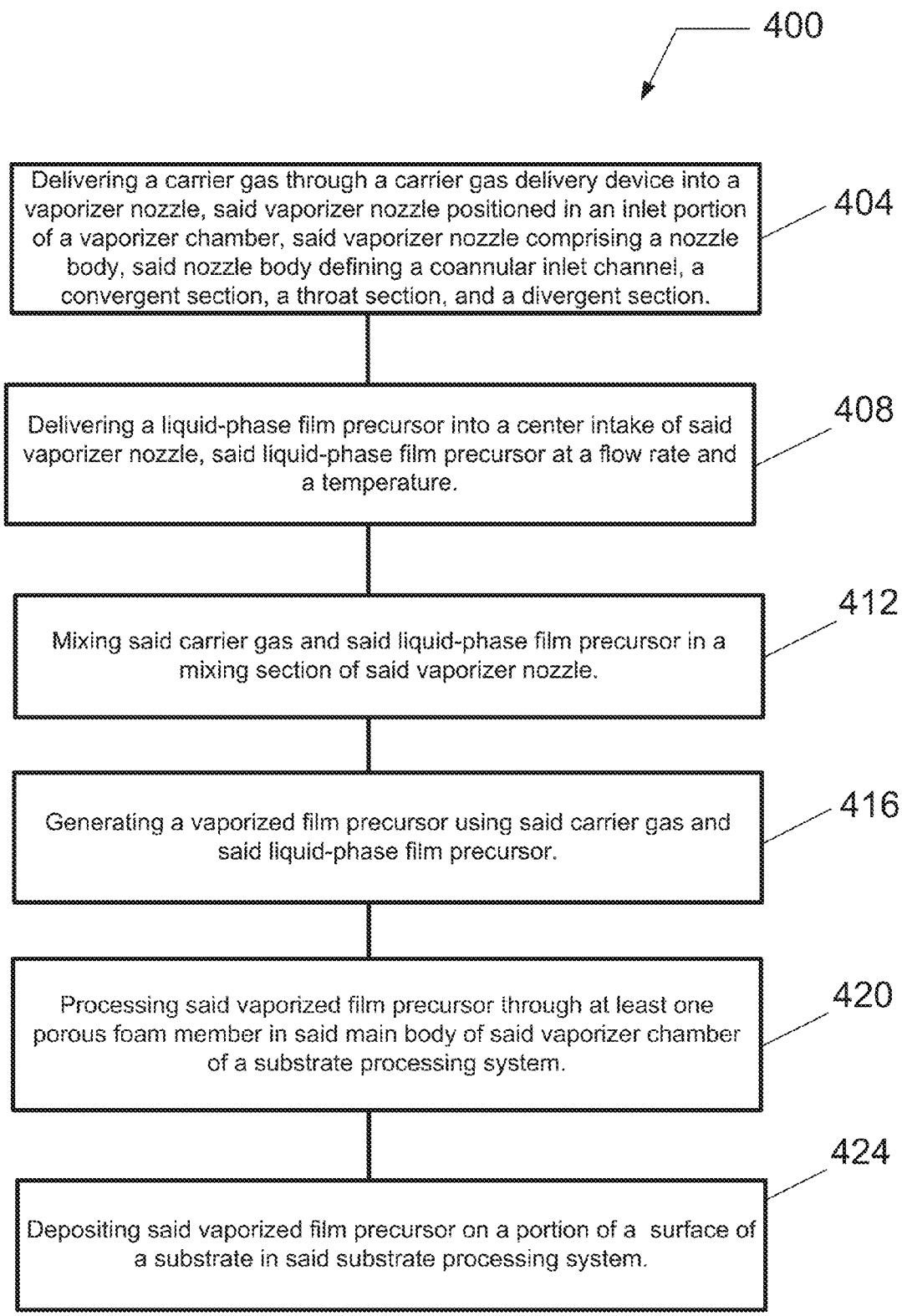
FIG. 4 is a flow chart illustrating an exemplary method for introducing a vapor-phase precursor into a substrate processing system in accordance with an embodiment of the present invention.

FIG. 4 is a flow chart 400 illustrating an exemplary method for introducing a vapor-phase precursor into a substrate processing system in accordance with an embodiment of the present invention. In operation 404, a carrier gas is delivered through a carrier gas delivery device into a vaporizer nozzle, said vaporizer nozzle positioned in an inlet portion of a vaporizer chamber, said vaporizer nozzle comprising a nozzle body, said nozzle body defining a coannular inlet channel, a convergent section, a throat section, and a divergent section. As mentioned above, gas sources can be configured to introduce a carrier gas, an inert gas, or a dilution gas though the carrier gas delivery device. For example, the inert gas, carrier gas or dilution gas can include a noble gas, i.e., He, Ne, Ar, Kr, Xe, or Rn. In an embodiment, the carrier gas is heated to a temperature of about 300 to 400° C. where the heated carrier gas removes water from the line before chemical flow starts. In addition, the preheated carrier gas adds energy for evaporation of the liquid-phase precursor and raises the minimum temperature of the liquid-phase precursor during the supersonic expansion of the gas flow coming out of the nozzle. Furthermore, the low pressure carrier gas is accelerated to supersonic levels in order to generate the smallest droplet size possible for the liquid-phase precursor.

In operation 408, a liquid-phase precursor is delivered into a center intake of said vaporizer nozzle, said liquid-phase precursor at a flow rate and a temperature. As mentioned above, fluorocarbon-organosilicon copolymer, monomer gases of a fluorocarbon precursor and organosilicon precursor can be used as the liquid-phase precursor. The vaporizer nozzle inlet end is cooled and nozzle center body supply keeps the material flow cool until the liquid-phase precursor is injected into the carrier gas flow, reducing the chance for decomposition and evaporation of the liquid-phase precursor at this stage.

The liquid-phase precursor may include one or more of the following chemicals: the formula $R^1{}_n(OR^2)_p(O(O)CR^4)_{3-n-p}Si-R^7-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that $n+m \geq 1$, $n+p \leq 3$, and $m+q \leq 3$.

In operation 412, said carrier gas and said liquid-phase precursor are mixed in a mixing section of said vaporizer nozzle. Several small openings in the sidewall (~0.10 mm diameter) release the liquid-phase precursor into the carrier gas flow. In one embodiment, two or more openings can be used. In another embodiment, at least six openings are used. The small surface area of each opening restricts evaporation at the openings. The liquid-phase precursor is supplied faster than the evaporation rate, thus reducing the effects of selective evaporation and resulting clogs. Redundancy of injection points for the liquid-phase precursor allows continued operation if one opening does clog up. In addition, injection of the liquid-phase precursor is just after the throat section of the nozzle in the gas flow, so a blockage at this point in the flow would quickly spike the pressure to hundreds of torr (pressure behind openings) and clearing the blockage. Furthermore, flow of the mixed liquid-phase precursor and carrier gas jet flow is slowly expanded to eliminate recirculation zones that might trap chemicals for extended periods of time. This is done by slowly expanding the jet flow of vaporized precursor and carrier gas to eliminate recirculation zones in the vaporizer chamber. Moreover, the thickness of the at least one foam member is at least 10% of the lateral dimension so as to ensure a slowly expanding cone instead of current art use of large liquid-phase delivery lines expanding abruptly into a large chamber. In addition, the half angle of the diverging conical section is limited to a small range of less than or equal to 30 or 40 degrees.

In operation 416, a vaporized precursor is generated using said carrier gas and said liquid-phase precursor. In operation 420, said vaporized precursor is processed through at least one porous foam member in said main body of said vaporizer chamber of a substrate processing system. The flow of the mixed liquid-phase precursor and carrier gas then enters at least one small pore foam member which is brazed to the container wall, where the container wall can be heated by band heaters or other types of heaters. In one embodiment, the small pore foam member is an aluminum foam which is brazed to the wall of the container wall, and the container wall is an aluminum tube. In another embodiment, other low pore foam member can include one or more of a member made from copper, tin, zinc, nickel, Inconel, silicon, silver, gold, silicon carbide, silicon nitride, silicon nitride carbide, boron carbide, boron nitride, hafnium carbide, tantalum carbide, and/or zirconium carbide.

Distance from a droplet to the container wall is greatly reduced so that wall temperatures of the container wall can also be greatly reduced as a result of the elimination of the thermal resistance. Some droplets of the liquid-phase precursor may hit the foam surface and flash vaporize, but the large surface area container wall and high thermal conductance to the container wall still allow temperatures to remain low, reducing the threat of decomposition of the liquid-phase precursor. As mentioned previously, in an embodiment, the at least one porous foam member can have a porosity ranging from about 5 pores per inch to about 200 pores per inch and in another embodiment, the porosity of the at least one porous foam member 228 can further have a porosity ranging from about 10 pores per inch to about 100 pores per inch. Alternatively, each of the porous foam members 228 may have a different porosity.

As also mentioned above, a controller coupled to one or more power sources, a temperature control system, a composition delivery system, a gas distribution system, and a vacuum pumping system is used to control the temperature and flow rate of the liquid-phase precursor, the percent concentration and temperature of the carrier gas, and initiator gas if used, the temperature of the vaporization chamber of the vaporizer, and the deposition rate and deposition uniformity of the precursor vapor. In operation 424, said vaporized precursor is deposited on a portion of a surface of a substrate in said substrate processing system. Tests using the vaporizer and nozzle described above and the methods described in FIG. 4 addressed the low deposition rate and poor deposition uniformity issues due to inefficient thermal decomposition and inadequate filament design and flow conditions. Moreover, clogging of the carrier gas delivery line was minimized by avoiding large delivery lines and large chambers. Use of a temperature control system, (22, FIG. 1), and/or a controller, (80, FIG. 1), to control the temperature of the vaporization operating variables on order to keep the flash evaporation and decomposition of the liquid-phase precursor in the acceptable ranges for the application.

Figure 5:
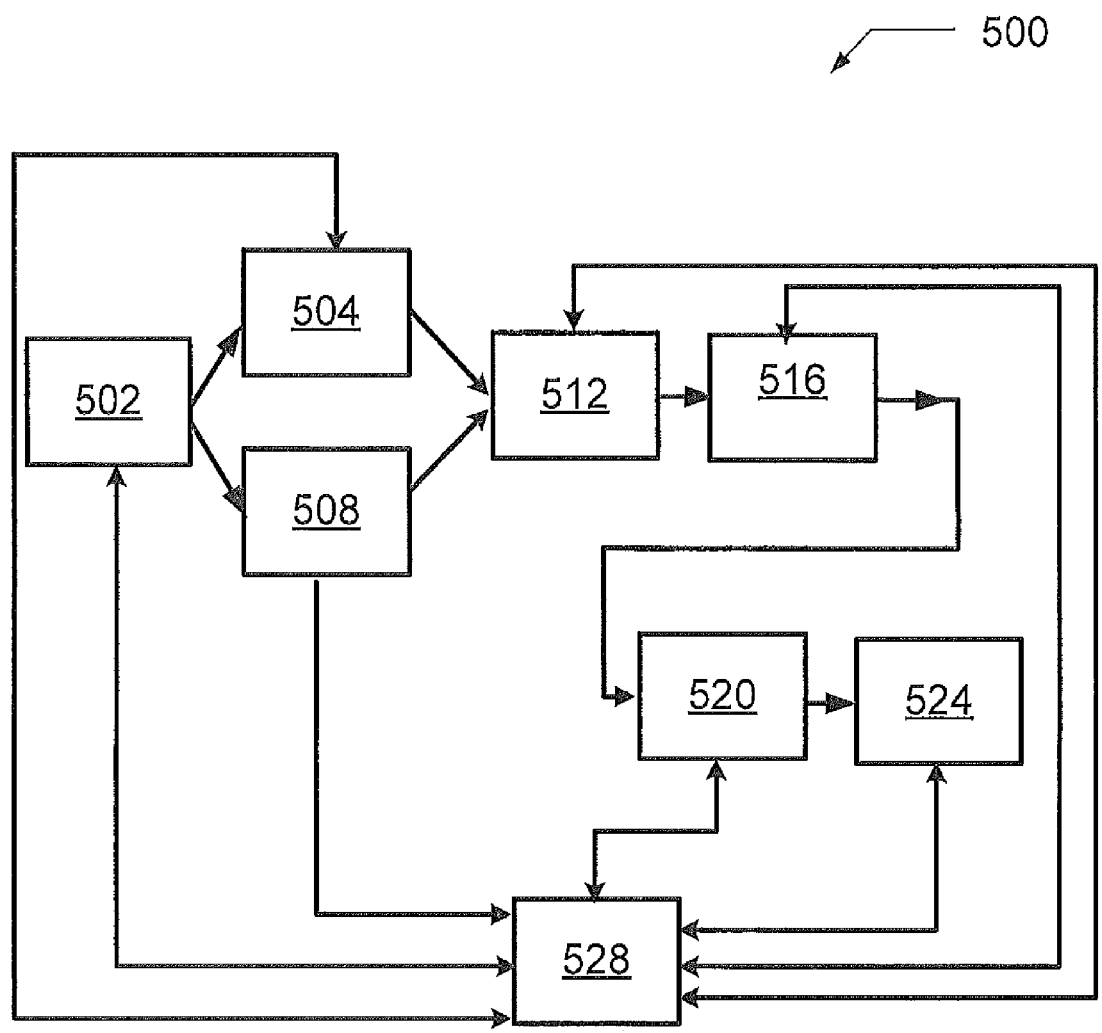
FIG. 5 is a process sequence chart illustrating the exemplary method of using a vaporizer in accordance with an embodiment of the present invention.

FIG. 5 is a process sequence chart 400 illustrating an exemplary method of using a vaporizer in a substrate processing system in accordance with an embodiment of the present invention. Referring to FIG. 5, in process sequence 502, the carrier gas is optionally preheated to a target range of 300 to 400 degrees Centigrade in order to remove water in the carrier gas delivery line before chemical flow starts. In addition, the preheated carrier gas adds energy for evaporation of the vapor-phase precursor and raises the minimum temperature in the supersonic expansion of the gas flow coming out of the vaporizer nozzle.

In process sequence 504, a carrier gas is delivered using a delivery device into the vaporizer nozzle of the vaporizer where the vaporizer is part of the substrate processing system. The vaporizer nozzle is positioned in an inlet portion of the vaporizer chamber, said vaporizer nozzle comprising a nozzle body, said nozzle body defining a coannular inlet channel, a convergent section, a throat section, and a divergent section. In process sequence 508, a liquid-phase precursor is concurrently delivered into a center intake of the vaporizer nozzle where the liquid-phase precursor is delivered at a flow rate and a temperature. In an embodiment, an inert gas or initiator material may be added to the liquid-phase precursor. In one embodiment, the inlet for the liquid-phase precursor is cooled and kept cool until injection into the carrier gas flow, thus reducing the chance for decomposition and evaporation while in transit inside the vaporizer nozzle.

In process sequence 512, the carrier gas and the liquid-phase precursor are mixed in a mixing section of the vaporizer nozzle. The carrier gas enters through the carrier gas inlet creating a high pressure zone on the opposite side of the nozzle body causing an unbalanced flow in the nozzle. To remove the imbalance, the carrier gas is diverted up through the inner annular channel and then down again toward the conical cavity (orifice), allowing the pressure to balance and the flow of fluids to stabilize. At about the end of the conical cavity, the liquid phase file precursor is injected into the supersonic flow using multiple side openings in the sidewall.

In process sequence 516, a vaporized precursor is generated using the carrier gas and the liquid-phase precursor. The cross section of the opening area in the annular mixing section is limited to allow for selective vaporization of multi-component fluids. In some cases, a solvent included in the liquid-phase precursor may flash-vaporize and leave behind the cooled liquid-phase precursor. By limiting the size of the openings, the available surface area available for evaporation is greatly reduced and as long as the fluid flow rate exceeds the vaporization rate of the solvent by some margin, the openings will still operate as desired.

In process sequence 520, the vaporized precursor is processed through at least one porous foam member in the main body of the vaporizer chamber of the substrate processing system. In process sequence 524, the vaporized precursor is deposited on a portion of a surface of a substrate in the substrate processing system. The number of porous foam members and porosity of each porous foam member are based on the requirements of the semiconductor application. Process sequence 528 is a concurrent and continuous process of sending control data or control instructions to the other process sequences and receiving of process results or metrology measurements from all the other process sequences. A controller, for example, 80 of FIG. 1, uses the data input and controls the operating variables to ensure the vaporizer meets vaporization objectives for the application.

While the present invention has been illustrated by a description of one or more embodiments thereof and while these embodiments have been described in considerable detail, they are not intended to restrict or in any way limit the scope of the appended claims to such detail. The gas distribution device with the vaporizer may be used in any system requiring gas heating. Other systems in semiconductor manufacturing and integrated circuit (IC) manufacturing may include etching systems, plasma-enhanced etching systems, thermal processing systems, and the like.

As mentioned above, design issues of current vaporizers includes problems with clogging in the vaporizer and delivery lines, chemical decomposition of the precursor, non-optimal size of the flash-evaporation droplets, and need for control of vaporization operating variables to meet the vaporization objectives. First, clogging issues are addressed by removing water from the delivery lines and in the vaporizer. Use of redundant injection points of the liquid-phase precursor into the supersonic carrier gas flow allows for continued operation even if one of the two or more openings is inoperative. Injection of the liquid-phase precursor just past the throat section would cause a quick spike in pressure behind the two or more openings and thereby cause self-clearing of the fluid flow. Clogging is further controlled with the use of smaller fluid passageways in the various sections of vaporizer and the vaporizer nozzle. Moreover, the area of the two or more openings is limited in order to reduce the effects of selective evaporation of components of the liquid-phase precursor and cause clogging due to accumulation of the residue.

Second, decomposition is also reduced with the avoidance of large hollow spaces in the vaporizer as there is less premature heating or overheating of the liquid-phase precursor that causes chemical decomposition. Less heat is needed to overcome the thermal resistance of low pressure gas jet in the vaporizer chamber. The gas jet is slowly expanded in the diverging area to eliminate recirculation zones that may trap portions of the gas jet for extended periods of time. Furthermore, the dimensions of the vaporizer are controlled in terms of the percentage of the thickness of the porous foam member compared the lateral dimension of the vaporizer chamber. Third, the size of the flash-evaporation droplets is controlled by accelerating the carrier gas to supersonic speeds in order to generate the smallest droplet size possible. Fourth, the use of the temperature control system and the controller for the vaporizer ensures the operating variables for vaporization process are kept within acceptable ranges.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

I claim:

1. A vaporizer for introducing a vapor-phase precursor into a substrate processing system, comprising:
   a vaporizer chamber having a vaporizer inlet, a vaporizer outlet, and a container wall extending between said vaporizer inlet and said vaporizer outlet and defining a vaporization volume there between, said container wall defining a lateral dimension of said vaporizer chamber, and wherein said vaporizer chamber comprises an entrant chamber portion characterized by a diverging cross-sectional area in a direction of vapor flow entering said vaporizer chamber from said vaporizer inlet; and
   at least one porous foam member arranged within said vaporizer chamber between said vaporizer inlet and said vaporizer outlet such that vapor flows through said at least one porous foam member, said at least one porous foam member in physical contact and thermal communication with said container wall, said at least one porous foam member having a thickness that is at least 10% said lateral dimension.

2. The vaporizer of claim 1, wherein one of said at least one porous foam member comprises a porosity ranging from about 5 pores per inch to about 200 pores per inch.

3. The vaporizer of claim 1, wherein one of said at least one porous foam member comprises a porosity ranging from about 10 pores per inch to about 100 pores per inch.

4. The vaporizer of claim 1, wherein said at least one porous foam member comprises an open celled metal foam.

5. The vaporizer of claim 1, wherein said at least one porous foam member comprises an open celled aluminum foam.

6. The vaporizer of claim 1, wherein said entrant chamber portion comprises a diverging conical section characterized by an entrant length and a half-angle defining said diverging conical section.

7. The vaporizer of claim 6, wherein said half angle is less than or equal to 40 degrees.

8. The vaporizer of claim 6, wherein said half angle is less than or equal to 30 degrees.

9. The vaporizer of claim 1, further comprising:
   a temperature control system having a temperature control element in thermal communication with said container wall and configured to elevate a temperature of said container wall in excess of 100 degrees C.

10. The vaporizer of claim 1,
    wherein said vaporizer chamber comprises an exhaust chamber portion characterized by a converging cross-sectional area in a direction of vapor flow exiting said vaporizer chamber through said vaporizer outlet.

11. The vaporizer of claim 1, further comprising:
    a vaporizer nozzle having a nozzle exit fluidically coupled to said vaporizer inlet to said vaporizer chamber.

12. The vaporizer of claim 11, wherein said vaporizer nozzle comprises:
    a nozzle body having an inlet end through which a liquid-phase precursor is introduced, a carrier gas inlet through which carrier gas is introduced, and an outlet end through which a gas jet containing a vapor-phase precursor and said carrier gas emanate from said nozzle body, said nozzle body defining a coannular inlet channel, a convergent section, a throat section, and a divergent section; and
    a nozzle center body longitudinally extending through said nozzle body from said inlet end to said outlet end, said nozzle center body having a first end with a flange configured to sealably couple to said inlet end of said nozzle body and a second end extending into said divergent section of said nozzle body, said nozzle center body further including a center conduit partially extending from said first end towards said second end along a centerline thereof to a conduit end and two or more openings through a sidewall of said nozzle center body,
    wherein said coannular inlet channel comprises an outer annular channel configured to receive said carrier gas from said carrier gas inlet, and an inner annular channel configured to receive said carrier gas from said outer annular channel and distribute said carrier gas for introduction into said throat section, and
    wherein said liquid-phase precursor, introduced through said inlet end, flows through said center conduit to said conduit end, exits said nozzle center body through said two or more openings in said sidewall in a direction substantially normal to said gas jet, and mixes with said carrier gas downstream of said throat section.

13. The vaporizer of claim 12, wherein said outer annular channel and said inner annular channel are arranged such that said carrier gas enters through said carrier gas inlet into said outer annular channel, flows in a direction opposite said gas jet towards said inlet end of said nozzle body, then enters said inner annular channel through an opening proximate said inlet end, and flows in the same direction as said gas jet to said throat section.

14. The vaporizer of claim 12, wherein said convergent section comprises an annular convergent section.

15. The vaporizer of claim 12, wherein said convergent section comprises a plurality of gas conduits coupling said inner annular channel to said throat section.

16. The vaporizer of claim 12, wherein said throat section comprises an annular throat section.

17. The vaporizer nozzle assembly of claim 12, wherein said nozzle body further defines a mixing section disposed between said throat section and said divergent section, and wherein said mixing section receives said carrier gas from said throat section and said vapor-phase precursor from said two or more openings in said sidewall of said nozzle center body, wherein said mixing section comprises an annular mixing section, and wherein said nozzle body and said nozzle center body form an annular throat section and an annular divergent section there between.

18. The vaporizer of claim 1:
wherein said at least one porous foam member comprises one of more of aluminum, copper, tin, zinc, nickel, Inconel, silicon, silver, gold, silicon carbide, silicon nitride, silicon nitride carbide, boron carbide, boron nitride, hafnium carbide, tantalum carbide, and zirconium carbide; or
wherein said vapor-phase precursor comprises sputter-deposited tungsten.

19. A vaporizer for introducing a vapor-phase precursor into a substrate processing system, comprising:
a vaporizer chamber having a vaporizer inlet, a vaporizer outlet, and a container wall extending between said vaporizer inlet and said vaporizer outlet and defining a vaporization volume there between, said container wall defining a lateral dimension of said vaporizer chamber;
at least one porous foam member arranged within said vaporizer chamber between said vaporizer inlet and said vaporizer outlet such that vapor flows through said at least one porous foam member, said at least one porous foam member in physical contact and thermal communication with said container wall, said at least one porous foam member having a thickness that is at least 10% said lateral dimension;
a vaporizer nozzle having a nozzle exit fluidically coupled to said vaporizer inlet to said vaporizer chamber, wherein said vaporizer nozzle comprises:
a nozzle body having an inlet end through which a liquid-phase precursor is introduced, a carrier gas inlet through which carrier gas is introduced, and an outlet end through which a gas jet containing a vapor-phase precursor and said carrier gas emanate from said nozzle body, said nozzle body defining a coannular inlet channel, a convergent section, a throat section, and a divergent section; and
a nozzle center body longitudinally extending through said nozzle body from said inlet end to said outlet end, said nozzle center body having a first end with a flange configured to sealably couple to said inlet end of said nozzle body and a second end extending into said divergent section of said nozzle body, said nozzle center body further including a center conduit partially extending from said first end towards said second end along a centerline thereof to a conduit end and two or more openings through a sidewall of said nozzle center body,
wherein said coannular inlet channel comprises an outer annular channel configured to receive said carrier gas from said carrier gas inlet, and an inner annular channel configured to receive said carrier gas from said outer annular channel and distribute said carrier gas for introduction into said throat section,
wherein said liquid-phase precursor, introduced through said inlet end, flows through said center conduit to said conduit end, exits said nozzle center body through said two or more openings in said sidewall in a direction substantially normal to said gas jet, and mixes with said carrier gas downstream of said throat section, and
wherein said nozzle body comprises:
an outer nozzle body having a cylindrical cavity partially extending inward from said inlet end towards said outlet end and a conical cavity partially extending inward from said outlet end towards said inlet end, wherein said conical cavity intersects with said cylindrical cavity to form an opening therebetween; and
an inner nozzle body insertable within said cylindrical cavity, said inner nozzle body having an opening configured to receive said nozzle center body extending there through from said inlet end to said outlet end, a cylindrical wall that separates said outer annular channel from said inner annular channel, and an inner surface that together with an outer surface of said nozzle center body defines said throat section and said divergent section,
wherein said outer nozzle body comprises a sealing surface located at said inlet end for sealably mating with said flange of said nozzle center body, and
wherein said carrier gas inlet is located on a side of said nozzle such that carrier gas enters said nozzle body in a direction substantially normal to said gas jet.

* * * * *